(12) United States Patent
Shimizu et al.

(10) Patent No.: US 9,966,329 B2
(45) Date of Patent: May 8, 2018

(54) METHOD FOR MANUFACTURING SEMICONDUCTOR DEVICE

(71) Applicant: Renesas Electronics Corporation, Tokyo (JP)

(72) Inventors: Fukumi Shimizu, Gunma (JP); Haruhiko Harada, Gunma (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days. days.

(21) Appl. No.: 15/660,294

(22) Filed: Jul. 26, 2017

(65) Prior Publication Data
US 2018/0090423 A1 Mar. 29, 2018

(30) Foreign Application Priority Data

Sep. 29, 2016 (JP) .................... 2016-191663

(51) Int. Cl.
*H01L 21/00* (2006.01)
*H01L 23/495* (2006.01)
(Continued)

(52) U.S. Cl.
CPC .... *H01L 23/49568* (2013.01); *H01L 21/4842* (2013.01); *H01L 21/561* (2013.01); *H01L 21/565* (2013.01); *H01L 21/67253* (2013.01); *H01L 22/12* (2013.01); *H01L 23/49503* (2013.01); *H01L 23/49537* (2013.01); *H01L 23/49541* (2013.01); *H01L 24/97* (2013.01); H01L 24/32 (2013.01); H01L 24/48 (2013.01);
(Continued)

(58) Field of Classification Search
CPC .. H01L 23/49568; H01L 21/561; H01L 24/97
See application file for complete search history.

(56) References Cited

U.S. PATENT DOCUMENTS 5,910,010 A * 6/1999 Nishizawa ............ H01L 21/565
257/E21.504
6,159,770 A * 12/2000 Tetaka ................. H01L 21/4832
257/E21.504
(Continued)

FOREIGN PATENT DOCUMENTS

| JP | 05243358 A | * | 9/1993 | ............ H01L 24/97 |
| JP | 2003197844 A | * | 7/2003 | ........... H01L 21/565 |
(Continued)

*Primary Examiner* — Laura Menz
(74) *Attorney, Agent, or Firm* — Mattingly & Malur, PC

(57) ABSTRACT

Reliability of a semiconductor device is improved. A method for manufacturing the semiconductor device includes the steps of: providing a lead frame having a semiconductor chip mounted thereon; providing a heat radiating frame having a heat radiating plate; and resin sealing the semiconductor chip and the heat radiating plate with the lead frame and the heat radiating frame in a stacked state. The method further includes the steps of: separating a frame body of the heat radiating frame from the lead frame having a sealing body; and applying an inspection to detect resin-unfilled regions to the lead frame having the sealing body. Since the frame body of the heat radiating frame shielding an inspection region is removed before the inspection, it becomes possible to perform the inspection using transmitted light.

13 Claims, 16 Drawing Sheets

(51) Int. Cl.
  *H01L 21/56* (2006.01)
  *H01L 21/66* (2006.01)
  *H01L 21/67* (2006.01)
  *H01L 21/48* (2006.01)
  *H01L 23/00* (2006.01)

(52) U.S. Cl.
  CPC .... *H01L 24/73* (2013.01); *H01L 2224/32245* (2013.01); *H01L 2224/48091* (2013.01); *H01L 2224/48247* (2013.01); *H01L 2224/73265* (2013.01)

(56) References Cited

U.S. PATENT DOCUMENTS

| | | | | |
|---|---|---|---|---|
| 6,849,933 B2 * | 2/2005 | Koike | ................. | H01L 23/4334 257/666 |
| 7,160,760 B2 * | 1/2007 | Hirashima | ............ | H01L 21/561 257/E21.504 |
| 8,399,302 B2 * | 3/2013 | Tanaka | .................. | H01L 21/566 257/666 |
| 9,018,745 B2 * | 4/2015 | Shimizu | .................. | H01L 24/97 257/676 |
| 9,293,396 B2 * | 3/2016 | Shimizu | .................. | H01L 24/97 |
| 9,741,641 B2 * | 8/2017 | Shimizu | .................. | H01L 24/97 |
| 2011/0300670 A1 * | 12/2011 | Tanaka | .................. | H01L 21/566 438/122 |
| 2011/0309384 A1 | 12/2011 | Ito et al. | | |
| 2014/0001620 A1 * | 1/2014 | Shimizu | .................. | H01L 24/97 257/676 |
| 2015/0194368 A1 * | 7/2015 | Shimizu | .................. | H01L 24/97 438/123 |
| 2016/0133548 A1 * | 5/2016 | Shimizu | .................. | H01L 24/97 257/676 |
| 2017/0309547 A1 * | 10/2017 | Shimizu | .................. | H01L 24/97 |

FOREIGN PATENT DOCUMENTS

| | | |
|---|---|---|
| JP | 2010-56325 A | 3/2010 |
| JP | 2012-9470 A | 1/2012 |

* cited by examiner

METHOD FOR MANUFACTURING SEMICONDUCTOR DEVICE

CROSS-REFERENCE TO RELATED APPLICATIONS

The disclosure of Japanese Patent Application No. 2016-191663 filed on Sep. 29, 2016 including the specification, drawings and abstract is incorporated herein by reference in its entirety.

BACKGROUND

The present invention is concerned with a method for manufacturing a semiconductor device and, in particular, with a technique which can be effectively applied to a method for manufacturing a semiconductor device having a built-in heat radiating plate in a lower portion of a semiconductor chip.

Japanese Unexamined Patent Application Publication No. 2012-9470 (Patent Document 1) discloses a technique for an inspection to detect resin-unfilled errors in a resin molding process before a dam bar is cut off.

Japanese Unexamined Patent Application Publication No. 2010-56325 (Patent Document 2) discloses a semiconductor device provided with a heat radiating plate which is large to such an extent that it overlaps with a tip part of a lead in a lower portion of a semiconductor chip. In this regard, the heat radiating plate is coupled to a lead frame before a resin sealing process.

PATENT DOCUMENTS

[Patent Document 1] Japanese Unexamined Patent Application Publication No. 2012-9470
[Patent Document 2] Japanese Unexamined Patent Application Publication No. 2010-56325

SUMMARY

Patent Document 1 describes that halogen-free members are used more frequently as high-fluidity sealing resins (for example, use of polycyclic aromatic epoxy resins, increased use of flexibilizers, and finely configuring and conglobation of fillers such as silica). In those cases, it is likely that the flow of melted resin during resin sealing of a semiconductor chip becomes dispersive, and resin-unfilled errors are not centralized on a particular portion but appear in various spots. Therefore, it is necessary to inspect the resin-unfilled errors all over a circumference (four sides) of a sealing body.

On the other hand, in order to achieve operations of semiconductor device at higher speed or at higher electric power, the semiconductor device having a built-in heat radiating plate has come into use. For example, as described in Patent Document 2, there is known a method of coupling the heat radiating plate to a lead frame with use of a "caulking technique" before a resin sealing process. However, due to an increase in number of processes, this method has an inherent problem of bringing about an increase in production cost and reduction in yield.

Therefore, the present inventors have been examining how to perform the resin sealing process where the lead frame retaining a plurality of leads and a frame (hereafter, called a "heat radiating frame") retaining the heat radiating plate are stacked without using the "caulking technique." However, it has turned out that the resin-unfilled error inspection cannot be performed in such a method because of the heat radiating frame, resulting in degradation of reliability of the semiconductor device.

As a consequence, improvement in the reliability of the semiconductor device having a built-in heat radiating plate is required.

Other objects and novel features of the present invention will become apparent from the description herein and the accompanying drawings.

A method for manufacturing a semiconductor device according to one embodiment includes the steps of: providing a lead frame having a semiconductor chip mounted thereon; providing a heat radiating frame having a heat radiating plate; and resin sealing the semiconductor chip and the heat radiating plate with the lead frame and the heat radiating frame in a stacked state. The method further includes the steps of: separating a frame body of the heat radiating frame from the lead frame having a sealing body; and, then, applying an inspection to detect resin-unfilled regions to the lead frame having the sealing body.

According to one embodiment, the reliability of the semiconductor device having the heat radiating plate can be improved.

DETAILED DESCRIPTION

Figure 1:
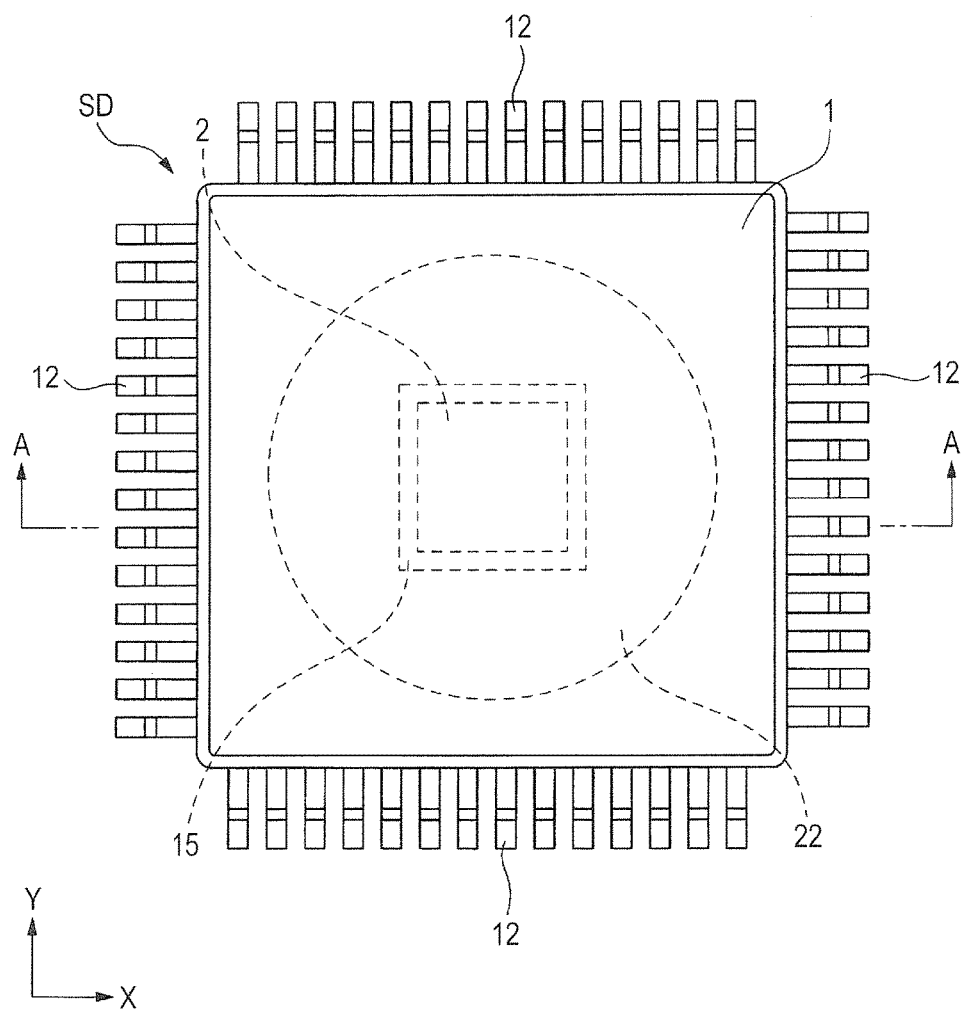
FIG. 1 is a plan view of a semiconductor device according to one embodiment.

In the following embodiment, explanations are made in the forms of divided plural sections or embodiments for convenience if necessary. Unless otherwise specified however, the explanations are not unrelated to each other and an explanation is related to a part or the all of another explanation as a modified example, a detailed explanation, a supplementary explanation, or the like.

Further, when the number of elements (including the number of pieces, numeric values, quantities, ranges, and others) is referred to in the following embodiment, except the case where the number of elements is specified or limited to a specific number obviously in theory or other cases, the number of elements is not limited to the specific number and may take a number above or below the specific number.

Still further, in the following embodiment, when constituent elements (including element steps or the like) are referred to, it is needless to say that they are not necessarily essential, except for the case where it is clearly specified in particular and where it is considered to be clearly not right from a theoretical point of view.

Likewise, in the following embodiment, when the shape, the positional relation, or the like of a constituent element of the like is referred to, it means that an expression or the like close or similar to the shape or the like is substantially included except the case where the shape or the like is specified or considered as not included obviously in theory or other cases. This statement also applies to the numerical value and range described above.

Yet further, elements having identical functions are marked with identical reference characters in principle over the entire drawings used for the explanations of the present embodiment and the repetition of the explanations is avoided. In addition, in the drawings used in the present embodiment, hatching is sometimes used partially in order to facilitate the visualization of a drawing even when the drawing is a plan view.

Embodiment

In regard to the present embodiment, a QFP (Quad Flat Package) type semiconductor device will be explained as an example.

<Semiconductor Device>

First, with reference to FIGS. 1 and 2, a configuration of a semiconductor device SD of the present embodiment will be explained. FIG. 1 is a plan view of the semiconductor device according to the present embodiment.

As shown in FIG. 1, the semiconductor device SD of the present embodiment has a quadrangular sealing body 1 and a plurality of leads 12. A sealing body 1 has four sides. At each side, the lead 12 protrudes from the sealing body 1 so as to extend in a direction perpendicular to the side.

In FIG. 1, broken lines show a semiconductor chip 2, a chip mounting part 15, and a heat radiating plate 22 which are covered with the sealing body 1. In a central part of the sealing body 1, a quadrangular semiconductor chip 2 is arranged. As will be described later, the semiconductor chip 2 is arranged over the quadrangular chip mounting part 15, and the circular heat radiating plate 22 is arranged below the chip mounting part 15.

In a plan view, in X and Y directions, the quadrangular chip mounting part 15 is larger than the quadrangular semiconductor chip 2. That is, in X and Y directions, one side of the chip mounting part 15 is larger than one side of the semiconductor chip 2. Further, the semiconductor chip 2 is arranged inside the chip mounting part 15 without lapping out of the chip mounting part 15. In this regard, X and Y directions are orthogonal to each other. Incidentally, a horizontal direction in FIG. 1 is referred to as "X direction" and a vertical direction is referred to as "Y direction," which also applies to cases in other drawings.

In X and Y directions, the circular heat radiating plate 22 is larger than the chip mounting part 15. In other words, an area of the heat radiating plate 22 is larger than an area of the chip mounting part 15. That is, in X and Y directions, a diameter of the heat radiating plate 22 is greater than one side of the chip mounting part 15. Also, the chip mounting part 15 is arranged inside the heat radiating plate 22 without lapping out of the heat radiating plate 22.

Further, the quadrangular shape referred to earlier includes a substantial quadrangular shape. That is, it includes a quadrangular shape whose corner portions are chamfered. Also, the shape of the heat radiating plate 22 is not limited to the circular one but may be a polygon such as a quadrangle, an octagon, etc.

The semiconductor device SD is a QFP (Quad Flat Package) type semiconductor device having a built-in heat radiating plate.

Figure 2:
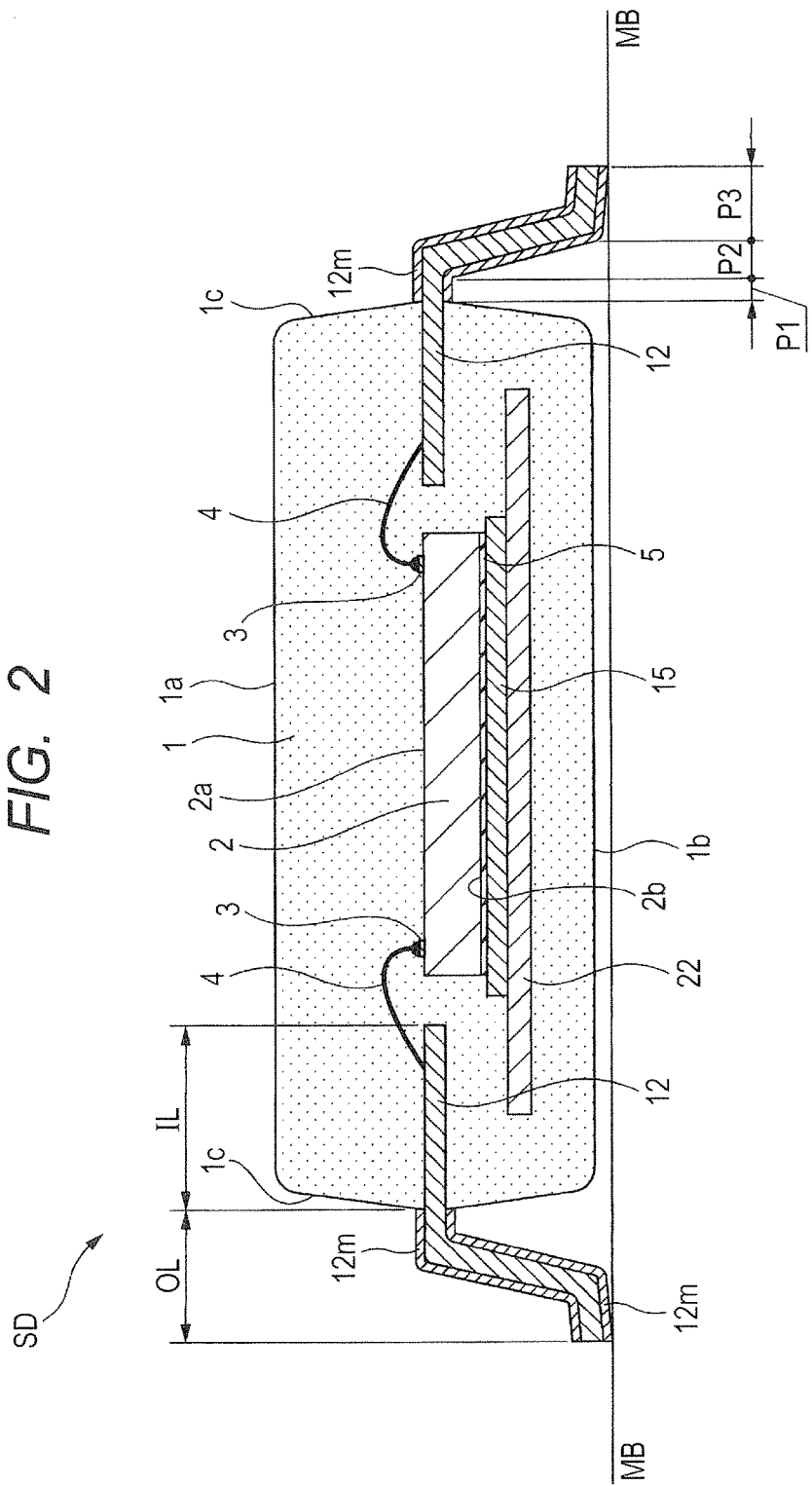
FIG. 2 is a cross-sectional view taken along line A-A of FIG. 1.

FIG. 2 is a cross-sectional view taken along line A-A of FIG. 1. In FIG. 2, the semiconductor device SD includes the semiconductor chip 2, the leads 12, the chip mounting part (tab) 15, the heat radiating plate 22, and the sealing body 1.

The semiconductor chip 2 is formed of a semiconductor substrate containing, for example, silicon (Si). Further, the semiconductor chip 2 includes: a plurality of semiconductor elements; a plurality of wirings; and a plurality of pad electrodes (a terminal, an external electrode, an external drawer electrode) 3. The semiconductor elements are, for example, MISFETs (Metal Insulator Semiconductor Field Effect Transistors). The wirings and the pad electrodes 3 are formed of metal films which include, for example, copper (Cu) or aluminum (Al) as a principal component. The semiconductor elements and the pad electrodes 3 are formed over a main surface 2a of the semiconductor chip 2. The semiconductor elements are coupled by a plurality of wirings (metal wirings) to form a circuit block, which is electrically coupled to the pad electrodes 3 via the wirings. Further, the pad electrodes 3 are electrically coupled with the leads 12. The pad electrodes 3 are coupled to the leads 12 containing, for example, copper (Cu) as a principal component by a wire (bonding wire) 4 containing gold (Au) or copper (Cu) as a principal component.

The sealing body 1 including a high-fluidity sealing resin (for example, epoxy resin, such as a polycyclic aromatic epoxy resin) covers the semiconductor chip 2, the wire 4, the leads 12, the chip mounting part 15, an adhesive layer 5, and the heat radiating plate 22. The semiconductor chip 2 is fixed to the chip mounting part 15 via the adhesive layer 5. The sealing body 1 has a flat main surface 1a, a flat back surface 1b, and a side surface 1c for joining the main surface 1a and the back surface 1b. With the semiconductor device SD mounted over a packaging substrate, the main surface 1a and the back surface 1b are in parallel to a packaging surface MB. Also, with the semiconductor device SD mounted over the packaging substrate, a side close to the packaging surface MB is defined as the back surface 1b of the sealing body 1, and a far side is defined as the main surface 1a of the sealing body 1.

The leads 12 are so arranged as to surround the semiconductor chip 2 in a radial manner with the semiconductor chip 2 being a center thereof. The leads 12 include copper (Cu) being a base material, and each of the leads 12 has a main surface on the main surface 1a side of the sealing body 1 and a back surface on the back surface 1b side of the sealing body 1. The lead 12 includes an inner lead portion IL located inside the sealing body 1 and an outer lead portion OL. A main surface and a back surface of the outer lead portion OL are covered with a solder plating film 12m.

The outer lead portion OL is in a gull-wing shape. Further, the outer lead portion OL includes: a protrusion P1 continuously protruding in a linear manner to the outside of the sealing body 1 from the inner lead portion IL; a bent portion P2 extending from the protrusion P1 toward the packaging surface MB; and a joint P3 extending, substantially in parallel to the packaging surface MB, from the bent portion P2 and coupled to the packaging substrate via packaging solder. In FIG. 2, although the protrusion P1, the bent portion P2, and the joint P3 are defined using the back surface side of the lead 12, the similar definition is made on the main surface side. On the back side of the lead 12, the outer lead portion OL includes the protrusion P1, the bent portion P2, and the joint P3.

The heat radiating plate 22 is a tabular member containing copper (Cu) as a principal component, and its main surface is arranged in contact with the back surface of the chip mounting part 15. In the heat radiating plate 22 and the chip mounting part 15, a surface on the side of the main surface 1a of the sealing body 1 is referred to as a main surface and a surface on the side of the back surface 1b of the sealing body 1 is referred to as a back surface. Moreover, in a lead frame and a heat radiating frame to be described later, similarly, a surface on the side of the main surface 1a of the sealing body 1 is referred to as a main surface and a surface on the side of the back surface 1b of the sealing body 1 is referred to as a back surface.

As shown in FIG. 2, the heat radiating plate 22 overlaps with part of the inner lead portion IL of the lead 12. That is, the heat radiating plate 22 is made large to such an extent that it overlaps with part of the inner lead portion IL. However, the heat radiating plate 22 is smaller than an outer shape of the sealing body 1 and an end portion of the heat radiating plate 22 terminates inside the sealing body 1. Moreover, although the back surface of the heat radiating plate 22 is covered with the sealing body 1, the back surface of the heat radiating plate 22 may be exposed from the back surface 1b of the sealing body 1.

<Method for Manufacturing Semiconductor Device>

Figure 3:
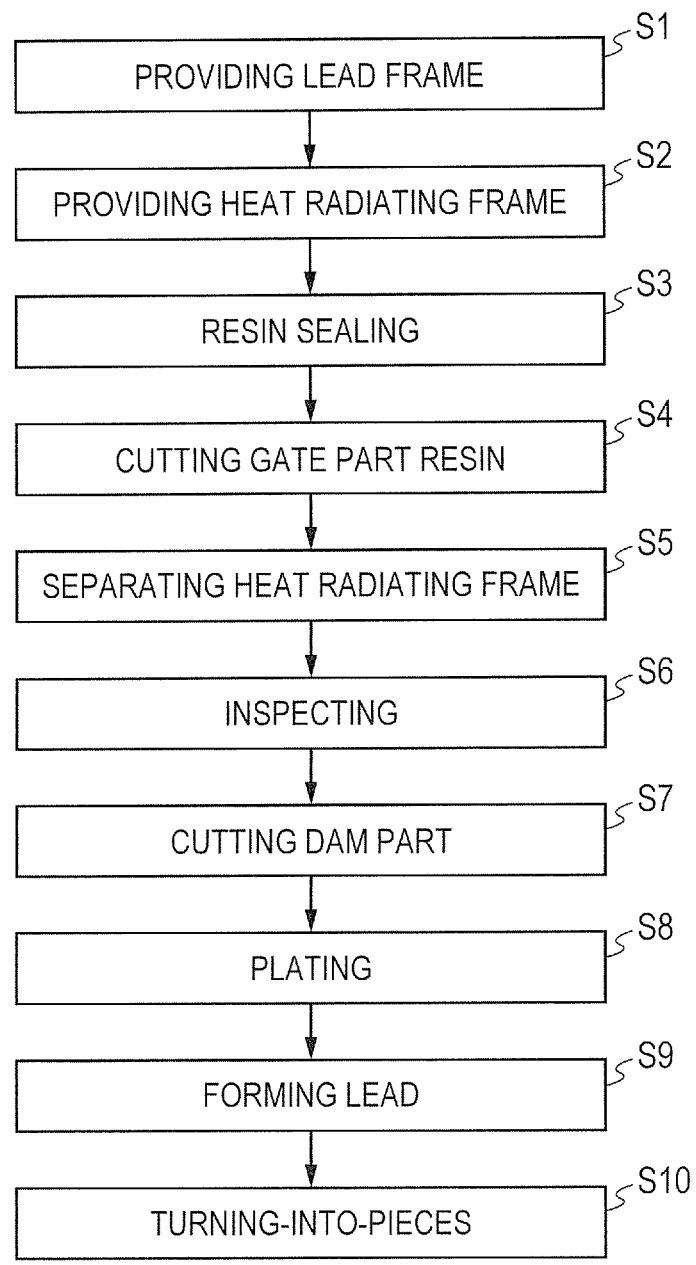
FIG. 3 is a process flowchart of the semiconductor device according to one embodiment.
Figure 4:
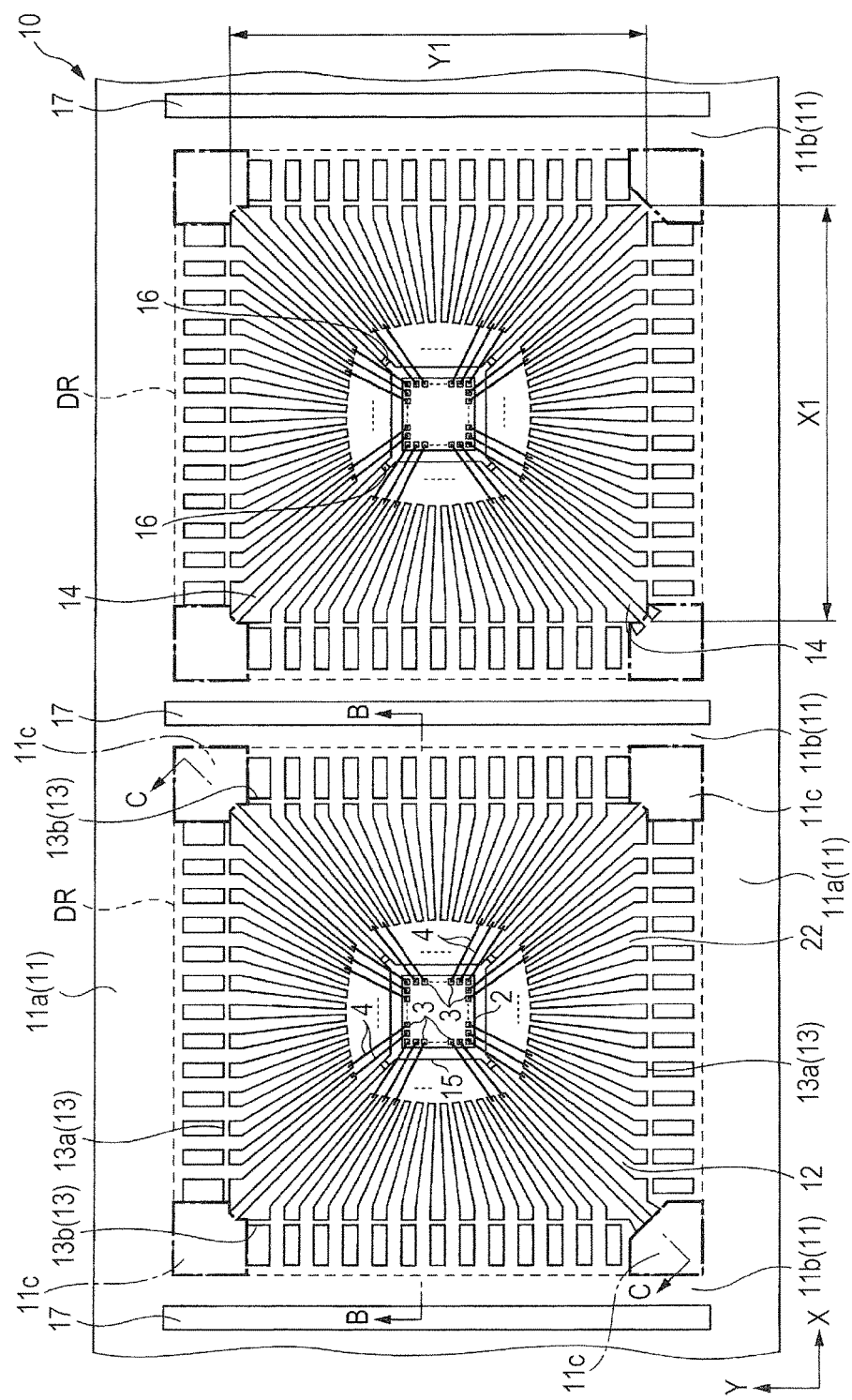
FIG. 4 is a plan view of a lead frame in a lead frame providing process shown in FIG. 3.
Figure 5:
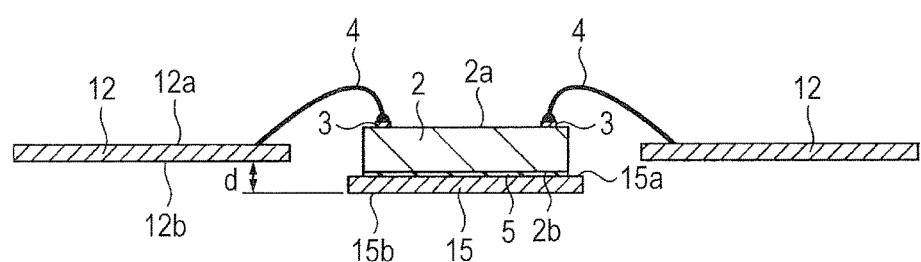
FIG. 5 is a cross-sectional view taken along line B-B of FIG. 4.
Figure 6:
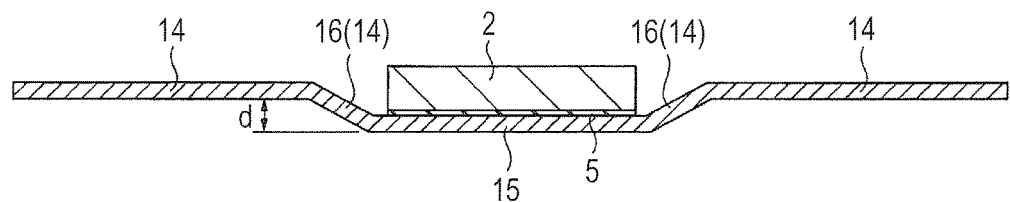
FIG. 6 is a cross-sectional view taken along line C-C of FIG. 4.
Figure 7:
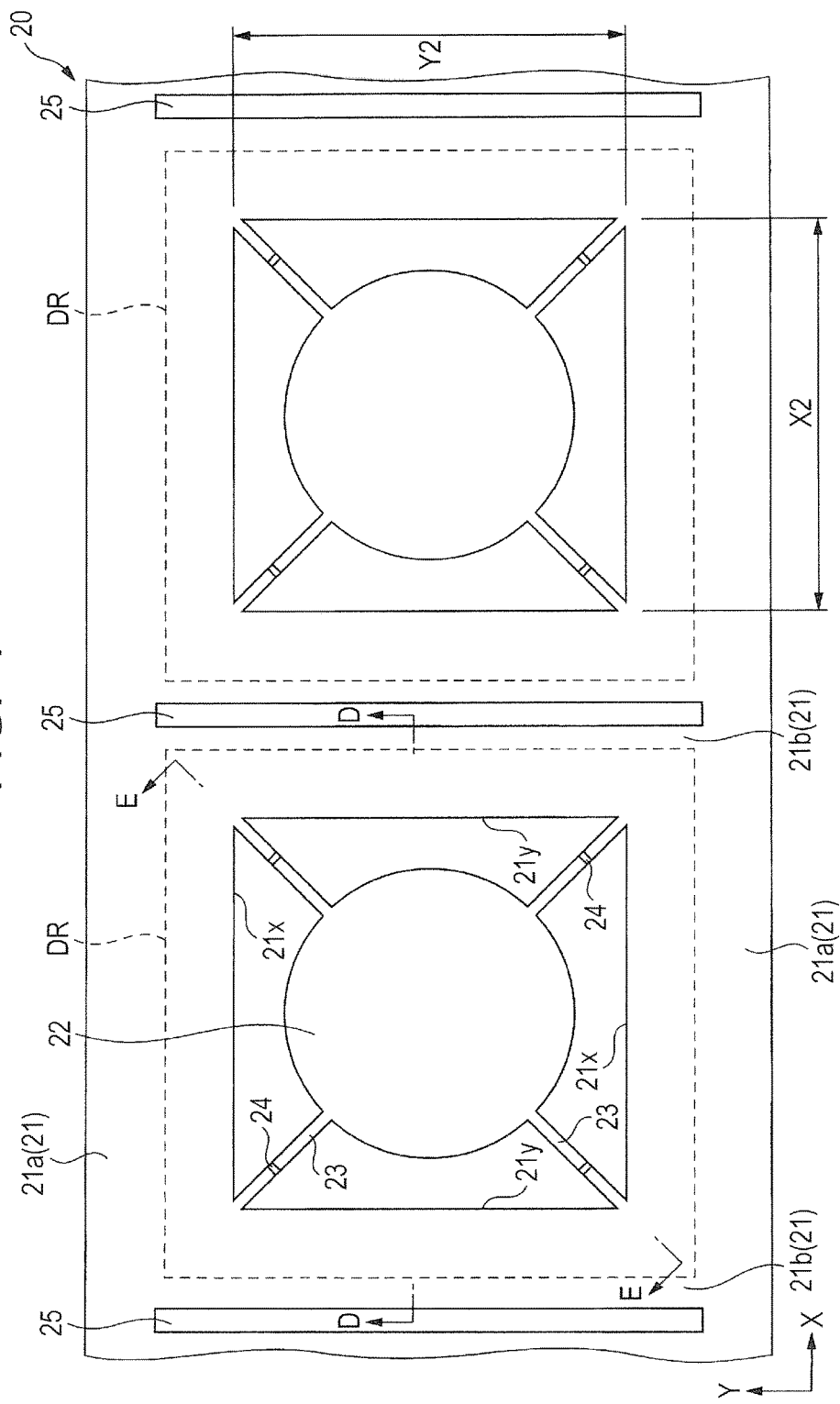
FIG. 7 is a plan view of a heat radiating frame in a heat radiating frame providing process shown in FIG. 3.
Figure 8:
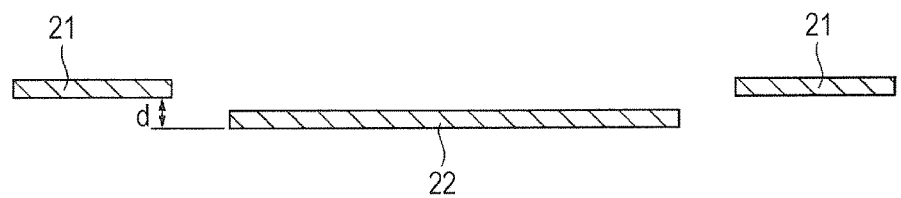
FIG. 8 is a cross-sectional view taken along line D-D of FIG. 7.
Figure 9:
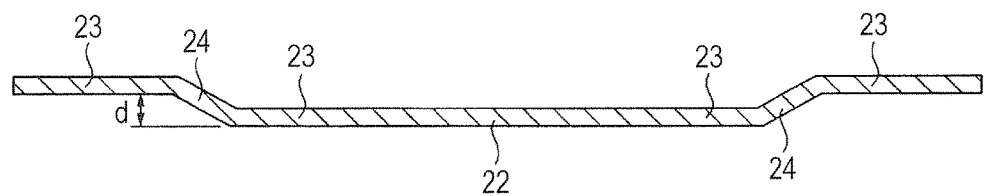
FIG. 9 is a cross-sectional view taken along line E-E of FIG. 7.
Figure 10:
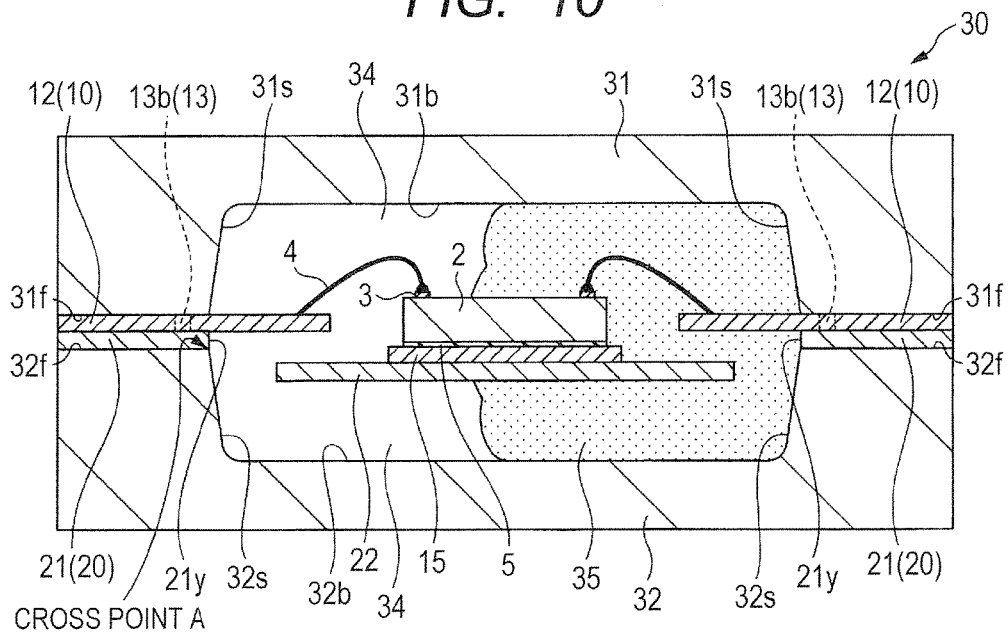
FIG. 10 is a cross-sectional view (corresponding to line B-B of FIG. 4) during a resin sealing process shown in FIG. 3.
Figure 11:
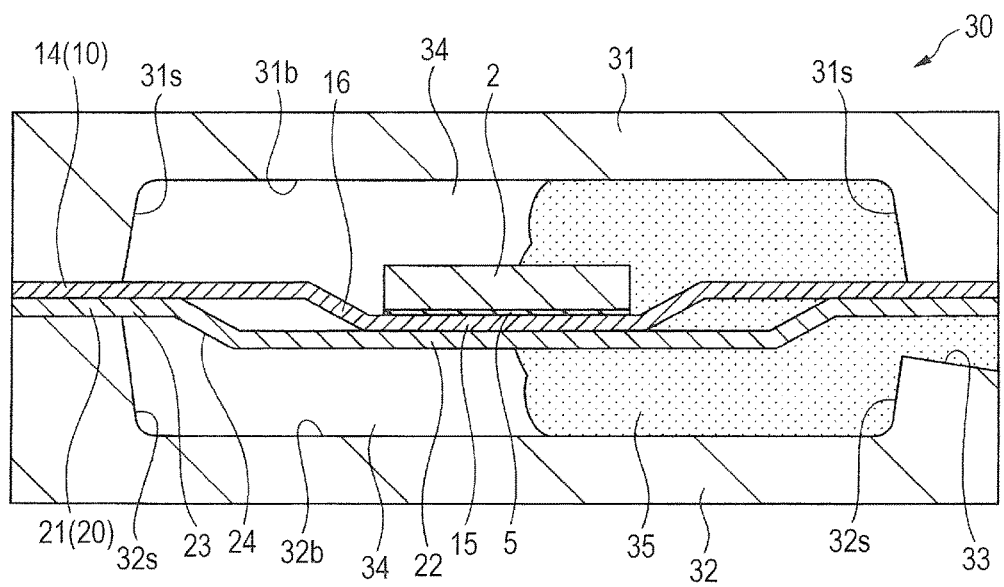
FIG. 11 is a cross-sectional view (corresponding to line C-C of FIG. 4) during the resin sealing process shown in FIG. 3.
Figure 12:
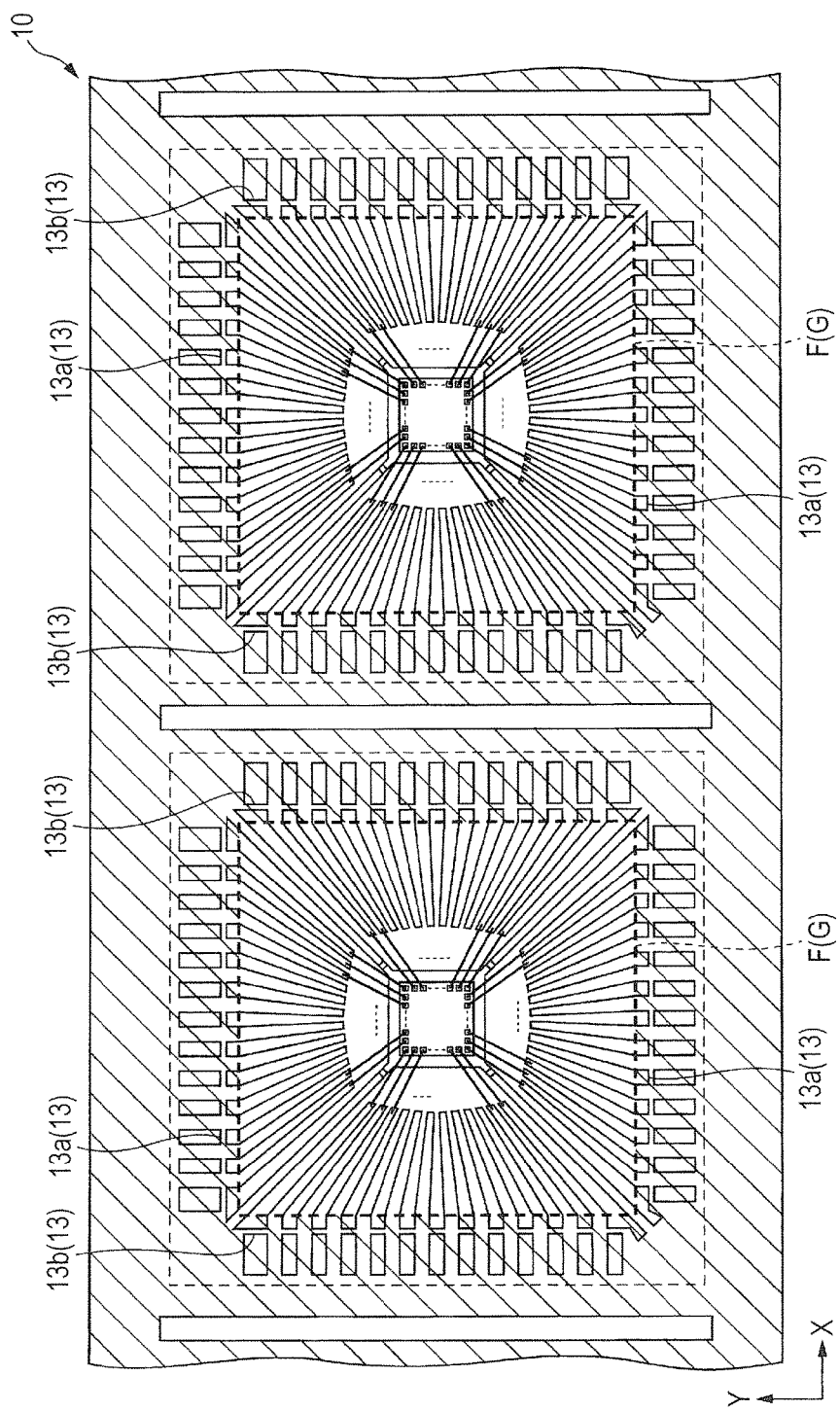
FIG. 12 is a plan view during the resin sealing process shown in FIG. 3.
Figure 13:
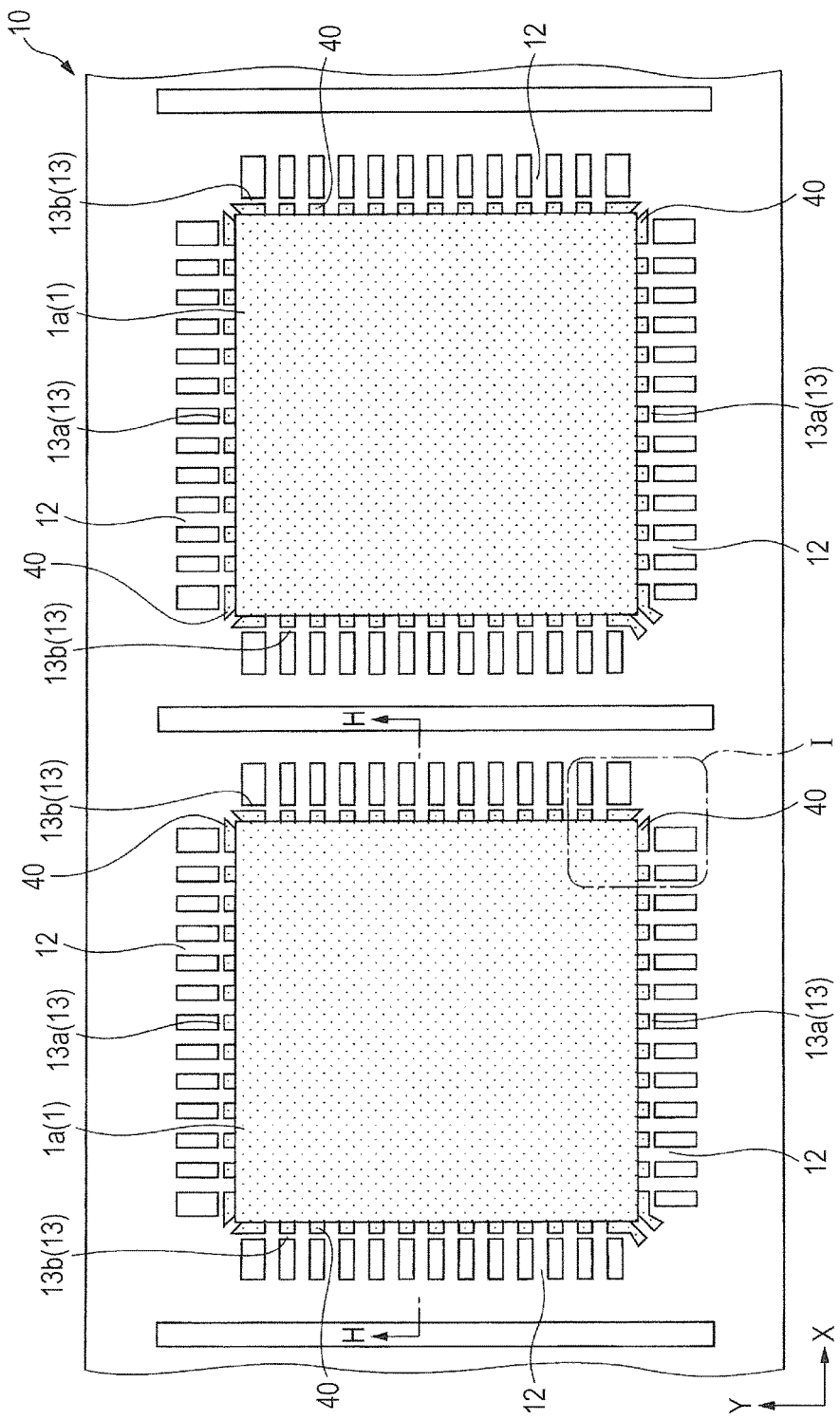
FIG. 13 is a plan view after completion of the resin sealing process shown in FIG. 3.
Figure 14:
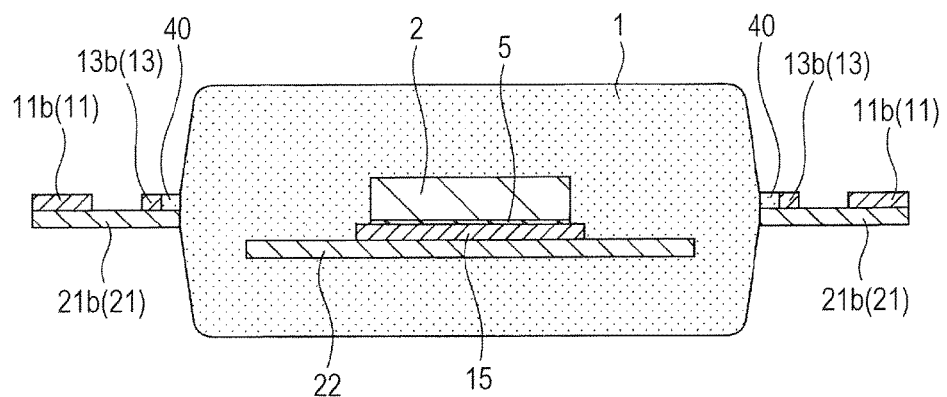
FIG. 14 is a cross-sectional view taken along line H-H of FIG. 13.
Figure 15:
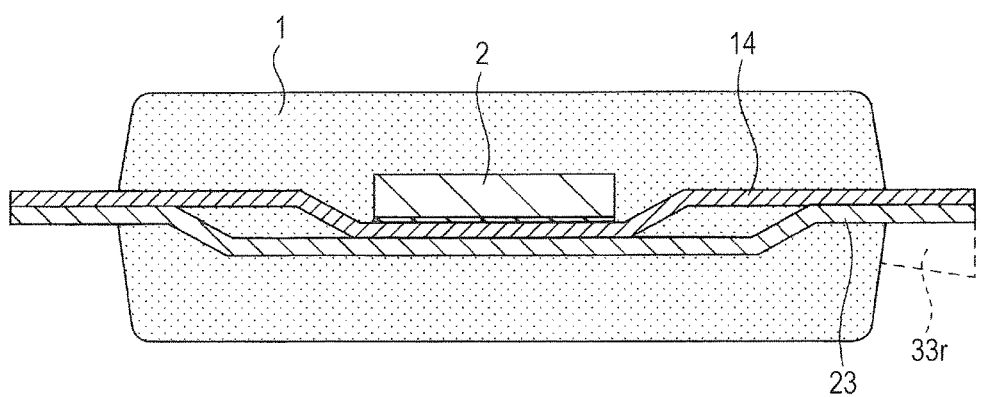
FIG. 15 is a cross-sectional view (corresponding to line C-C of FIG. 4) during a gate part resin cutting process shown in FIG. 3.
Figure 16:
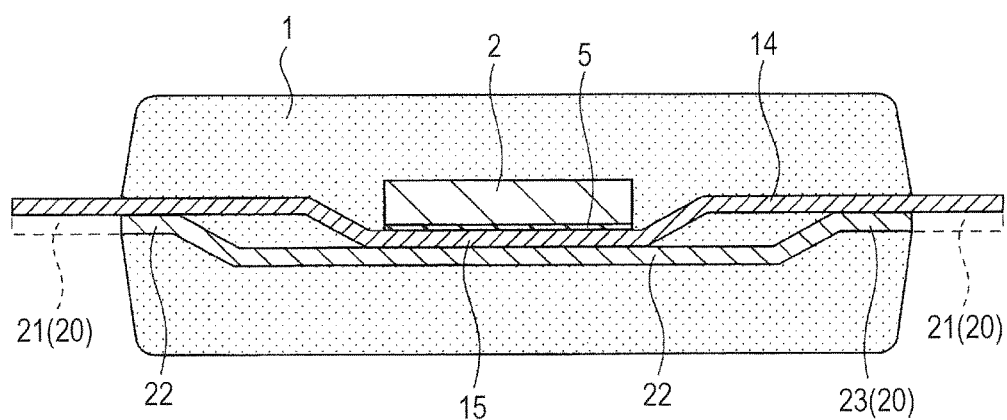
FIG. 16 is a cross-sectional view (corresponding to line C-C of FIG. 4) during a heat radiating frame separating process shown in FIG. 3.
Figure 17:
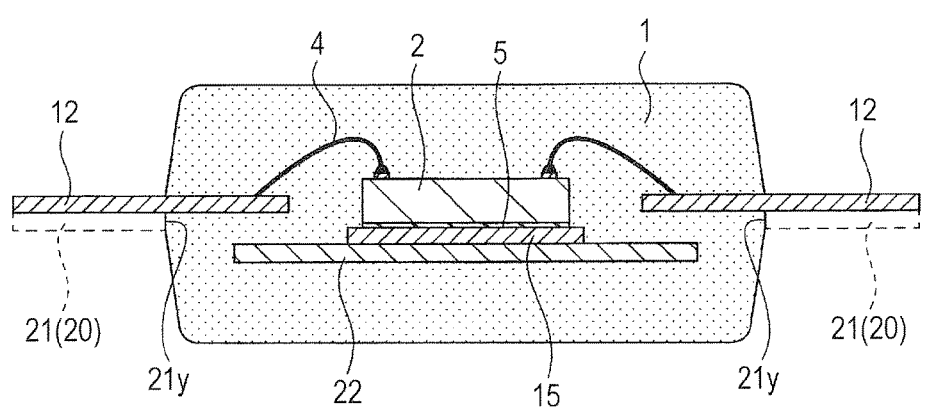
FIG. 17 is a cross-sectional view (corresponding to line B-B of FIG. 4) during the heat radiating frame separating process shown in FIG. 3.
Figure 18:
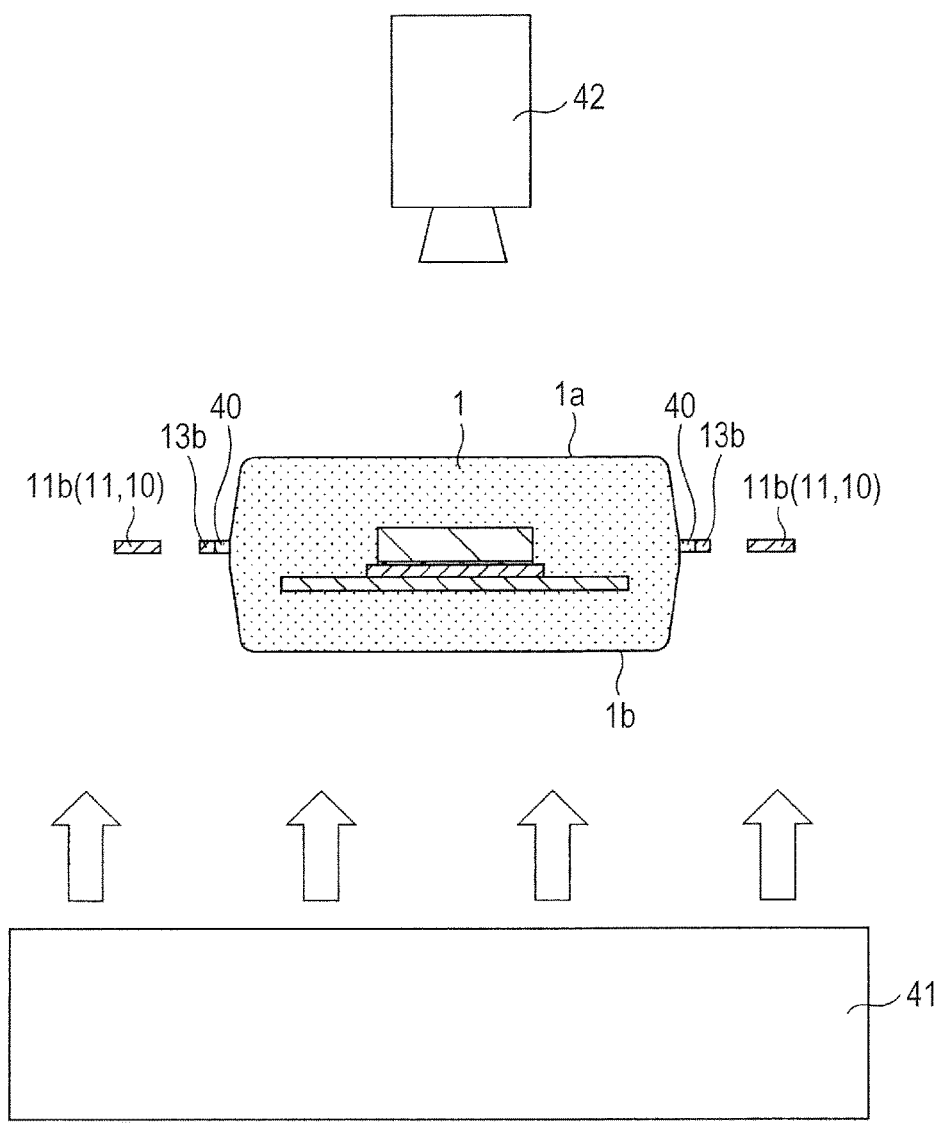
FIG. 18 is a cross-sectional view during an inspecting process shown in FIG. 3.
Figure 19:
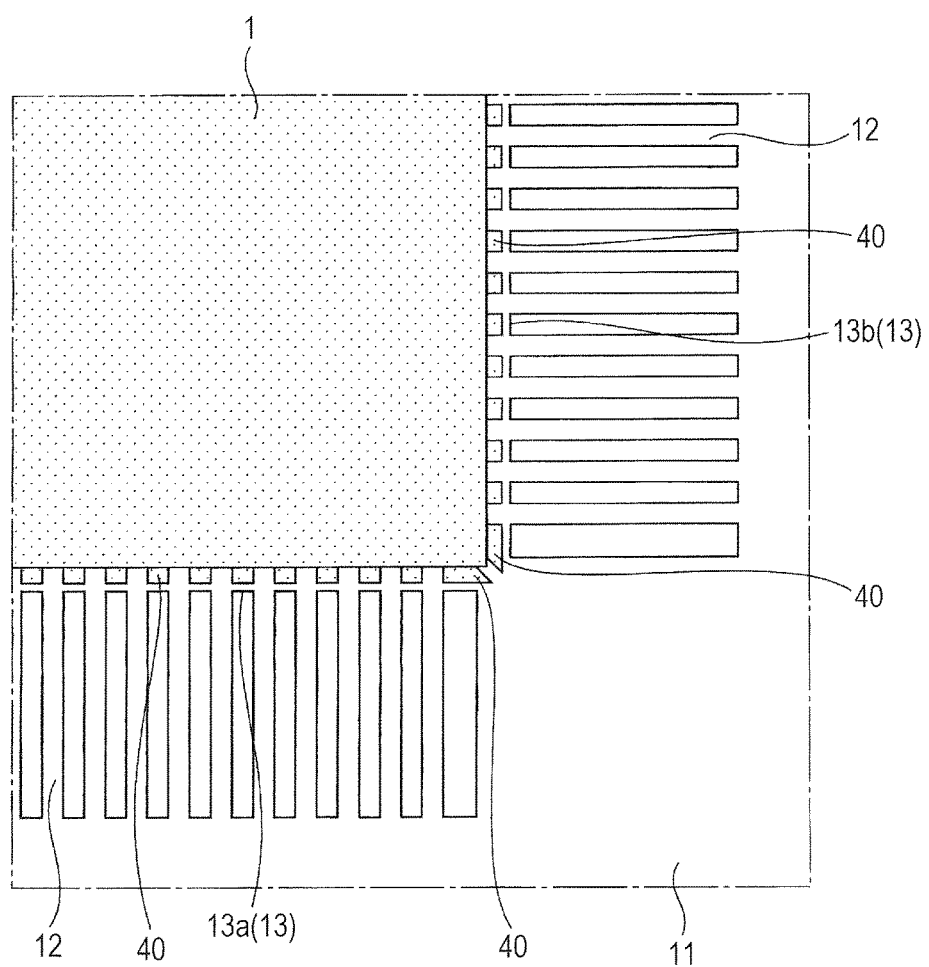
FIG. 19 is a fragmentary enlarged plan view of an inspection region in the inspecting process shown in FIG. 3.
Figure 20:
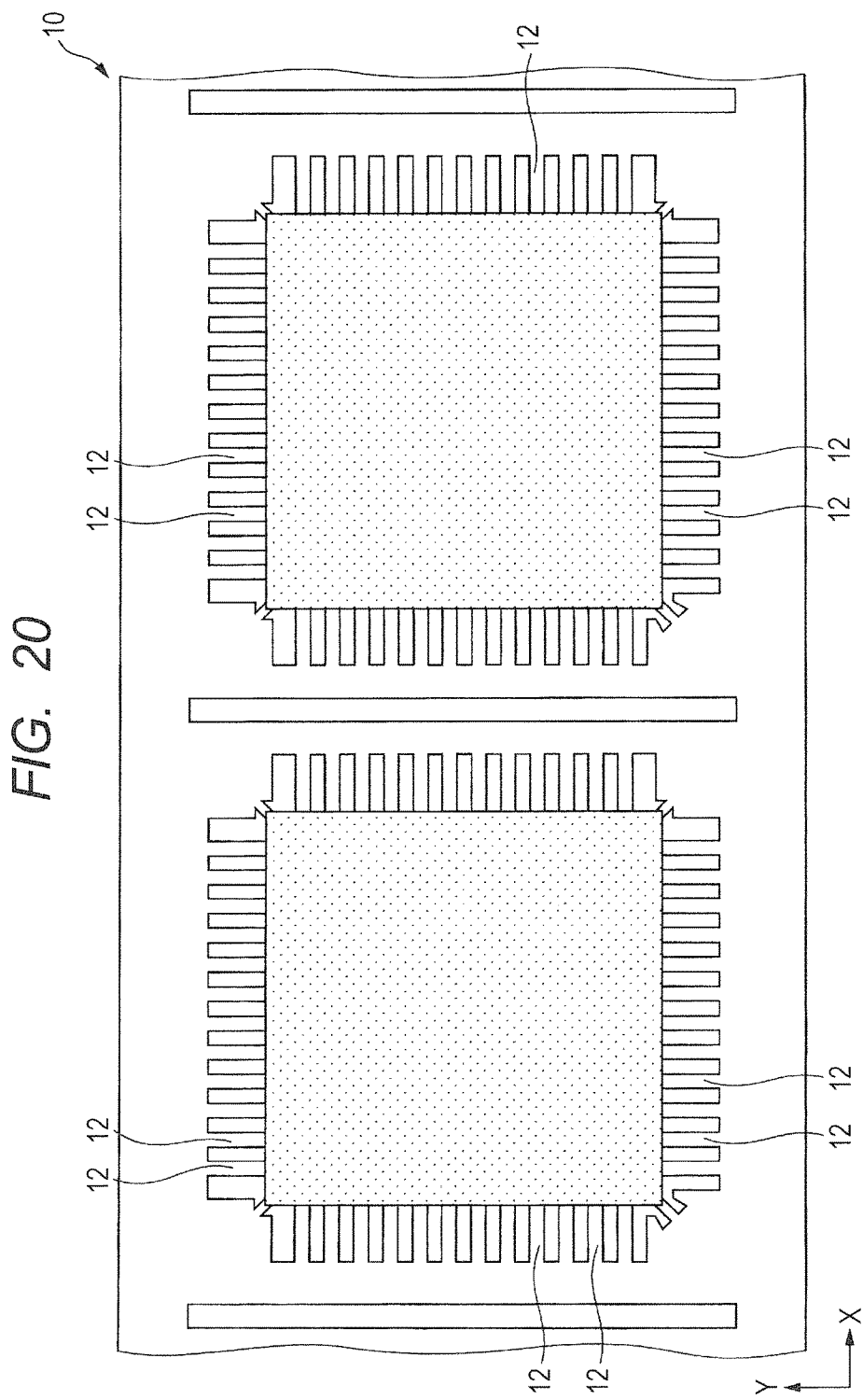
FIG. 20 is a plan during a dam part cutting process shown in FIG. 3.
Figure 21:
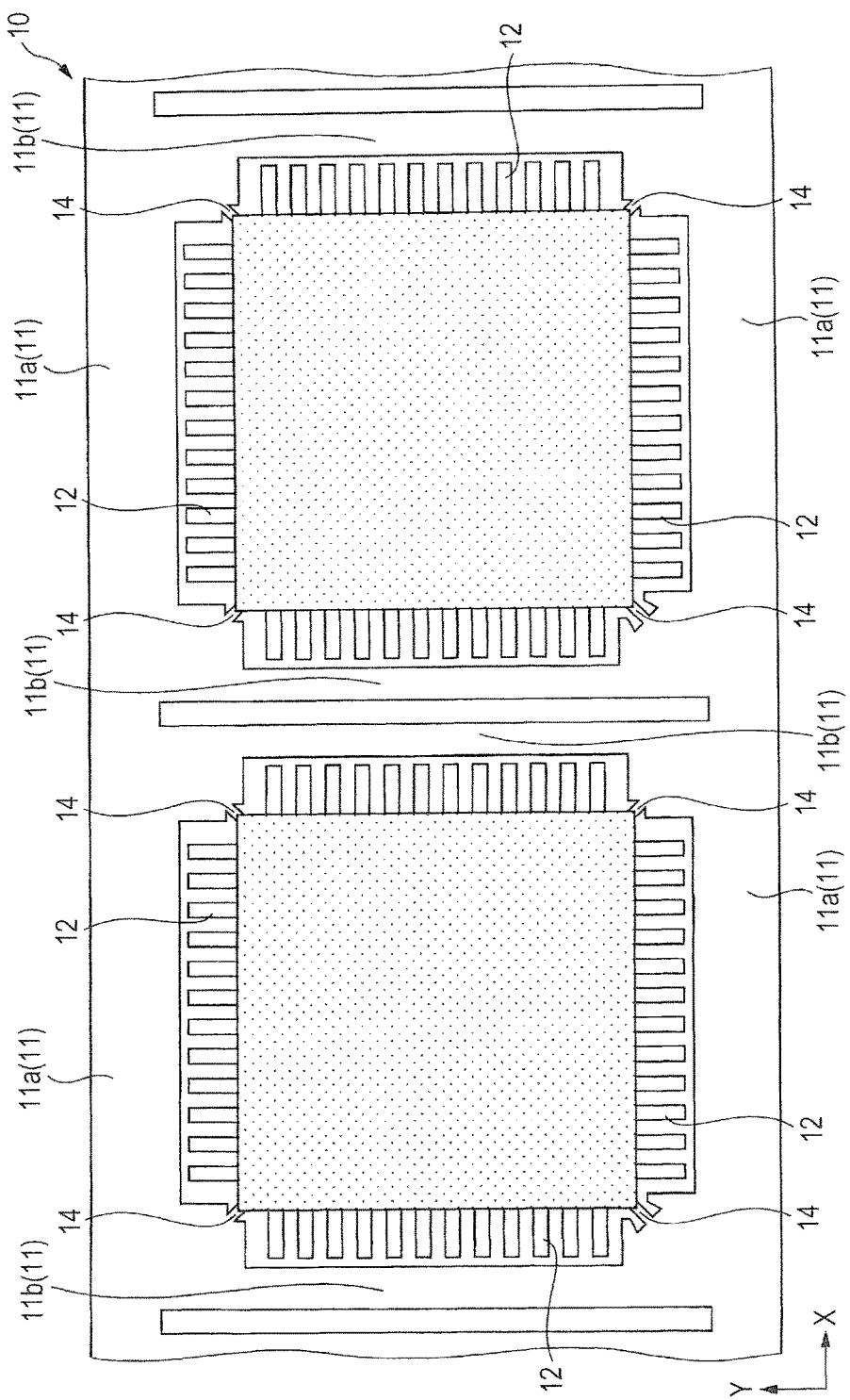
FIG. 21 is a plan view during a lead forming process shown in FIG. 3.

Next, with reference to FIG. 3, a method for manufacturing the semiconductor device SD of the present embodiment will be explained. FIG. 3 is a process flowchart of the semiconductor device SD. FIG. 4 is a plan view of a lead frame in a lead frame providing process shown in FIG. 3. FIG. 5 is a cross-sectional view taken along line B-B of FIG. 4. FIG. 6 is a cross-sectional view taken along line C-C of FIG. 4. FIG. 7 is a plan view of a heat radiating frame in a heat radiating frame providing process shown in FIG. 3. FIG. 8 is a cross-sectional view taken along line D-D of FIG. 7. FIG. 9 is a cross-sectional view taken along line E-E line of FIG. 7. FIG. 10 is a cross-sectional view (corresponding to line B-B of FIG. 4) during a resin sealing process shown in FIG. 3. FIG. 11 is a cross-sectional view (corresponding to line C-C of FIG. 4) during the resin sealing process shown in FIG. 3. FIG. 12 is a plan view during the resin sealing process shown in FIG. 3. FIG. 13 is a plan view after completion of the resin sealing process shown in FIG. 3. FIG. 14 is a cross-sectional view taken along line H-H of FIG. 13. FIG. 15 is a cross-sectional view (corresponding to line C-C of FIG. 4) during a gate part resin cutting process shown in FIG. 3. FIG. 16 is a cross-sectional view (corresponding to line C-C of FIG. 4) during a heat radiating frame separating process shown in FIG. 3. FIG. 17 is a cross-sectional view (corresponding to line B-B of FIG. 4) during the heat radiating frame separating process shown in FIG. 3. FIG. 18 is a cross-sectional view during an inspecting process shown in FIG. 3. FIG. 19 is a fragmentary enlarged plan view of an inspection region in the inspecting process shown in FIG. 3. FIG. 20 is a plan view during a dam part cutting process shown in FIG. 3. FIG. 21 is a plan view during a lead shaping process shown in FIG. 3.

First, as shown in FIGS. 4 to 6, the lead frame providing process (step S1) in the process flowchart of FIG. 3 is performed. FIG. 4 is the plan view of the lead frame in the lead frame providing process shown in FIG. 3.

As shown in FIG. 4, in the lead frame 10, a plurality of device regions DR are arranged in X direction at predetermined intervals. Each of the device regions DR in a substantially quadrangular shape is a region for one semiconductor device SD to be formed therein. The device region DR is surrounded by two horizontal frames 11a extending in X direction and two vertical frames 11b extending in Y direction. In the vertical frame 11b between the device regions DR, a slit 17 extending in Y direction is formed. Further, a frame body 11 includes: the two horizontal frames 11a extending in X direction; a plurality of vertical frames 11b joining the two horizontal frames 11a and each having the slit 17; and four convex portions 11c protruding from the horizontal frames 11a and the vertical frames 11b to corner portions of the device region DR at intersecting portions of the horizontal frames 11a and the vertical frames 11b.

In a central part of the device region DR, the quadrangular chip mounting part 15 is arranged. Further, corner portions of the chip mounting part 15 are coupled to the frame body 11 (specifically, the convex portions 11c of the frame body 11) via suspending leads 14. Around the chip mounting part 15, the leads 12 are arranged in a radial manner. One end of the lead 12 terminates in the vicinity of the chip mounting part 15 and the other end of the lead 12 is coupled to either the horizontal frame 11a or the vertical frame 11b.

A dam part 13 extends in a direction perpendicular to an extending direction of the leads 12, and joins the adjacent leads 12 as well as the lead 12 and the convex portion 11c. The dam part 13 includes two horizontal dams 13a extending in X direction and two vertical dams 13b extending in Y direction. A spacing between the two opposed vertical dams 13b (side closer to the chip mounting part 15) is referred to as "X1," and a spacing between the two opposed horizontal dams 13a (side closer to the chip mounting part 15) is referred to as "Y1."

With respect to the lead frame 10, a desired pattern is formed by applying press processing or etching to one metal plate which contains copper (Cu), for example, as a principal component. Consequently, the frame body 11, the lead 12, the chip mounting part 15, the suspending lead 14, and the dam part 13 are integrally formed. A film thickness of the lead frame 10 is, for example, about 0.15 mm.

Further, the semiconductor chip 2 having the pad electrodes 3 is fixed over the chip mounting part 15. The pad electrodes 3 are coupled to the corresponding leads 12 via wires 4.

FIG. 5 is the cross-sectional view taken along line B-B of FIG. 4, and FIG. 6 is the cross-sectional view taken along line C-C of FIG. 4. As shown in FIG. 6, in a stepped portion 16, bend processing is given to the suspending lead 14. Therefore, a back surface of the chip mounting part 15 is lower than a back surface of the suspending lead 14 by a distance d. In other words, the back surface of the chip mounting part 15 is closer to the back surface 1a of the sealing body 1 than the back surface of the suspending lead 14 by the distance d.

Moreover, as shown in FIG. 5, the back surface of the chip mounting part 15 is lower than the back surface of the lead 12 by the distance d. In other words, the back surface of the chip mounting part 15 is closer to the back surface 1a of the sealing body 1 than the back surface of the lead 12 by the distance d.

Next, as shown in FIGS. 7 to 9, the heat radiating frame providing process (step S2) in the process flowchart of FIG. 3 is performed. FIG. 7 is the plan view of the heat radiating frame in the heat radiating frame providing process shown in FIG. 3.

As shown in FIG. 7, in the heat radiating frame (heat radiating lead frame) 20, a plurality of device regions DR are arranged in X direction at predetermined intervals. The device region DR shown in FIG. 7 is equivalent to the device region DR shown in FIG. 4. Each of the device regions DR is surrounded by two horizontal frames 21a extending in X direction and two vertical frames 21b extending in Y direction. In the vertical frame 21b between the device regions DR, a slit 25 extending in Y direction is formed. Further, a frame body 21 includes the two horizontal frames 21a extending in X direction and the vertical frames 21b joining the two horizontal frames 21a and each having the slit 25. A width of the heat radiating frame 20 in Y direction is equal to a width of the lead frame 10 in Y direction. Further, the slits 17 and 25 are of the same shape and are disposed at corresponding positions. However, the width of the horizontal frame 21a and the vertical frame 21b of the heat radiating lead 20 is greater than the width of the horizontal frame 11a and the vertical frame 11b of the lead frame 10 shown in FIG. 4. Therefore, as in FIG. 7, the device region DR includes part of the horizontal frame 21a and the vertical frame 21b.

In a central part of the device region DR, a circular heat radiating plate 22 is arranged. Four portions of the heat radiating plate 22 are coupled to the frame body 21 via suspending leads 23.

As shown in FIG. 7, the two horizontal frames 21a extending in X direction have sides 21x on the heat radiating plate 22 side, and two vertical frames 21b extending in Y direction have sides 21y on the heat radiating 22 side. A spacing between the opposed sides 21y is referred to as "X2," and a spacing between the opposed sides 21x is referred to as "Y2." In this regard, the spacing X2 is smaller than the spacing X1 (X2<X1), and the spacing Y2 is smaller than the spacing Y1 (Y2<Y1). Therefore, an area S2 of a region surrounded by the two sides 21x and the two sides 21y can be expressed as S2=X2×Y2. Moreover, an area S1 of a region surrounded by the two horizontal dams 13a and the two vertical dams 13b in FIG. 4 can be expressed as S1=X1×Y1. Therefore, the area S2 is smaller than the area S1 (S2<S1).

FIG. 8 is the cross-sectional view taken along line D-D of FIG. 7, and FIG. 9 is the cross-sectional view taken along line E-E of FIG. 7. As shown in FIG. 9, in a stepped portion 24, bend processing is given to the suspending lead 23. Therefore, a back surface of the heat radiating plate 22 is lower than a back surface of the suspending lead 23 by the distance d. In other words, the back surface of the heat radiating plate 22 is closer to the back surface 1a of the sealing body 1 than the back surface of the suspending lead 23 by the distance d.

With respect to the heat radiating frame 20, a desired pattern is formed by applying press processing or etching to one metal plate, for example, containing copper (Cu) as a principal component. Consequently, the frame body 21, the heat radiating plate 22, and the suspending lead 23 are integrally formed. A film thickness of the heat radiating frame 20 is greater than that of the lead frame 10 and is, for example, about 0.2 mm.

Moreover, as shown in FIG. 8, the back surface of the heat radiating plate 22 is lower than a back surface of the frame body 21 by the distance d. In other words, the back surface of the heat radiating plate 22 is closer to the back surface 1a of the sealing body 1 than the back surface of the frame body 21 by the distance d.

Also, the order of the lead frame providing process (step S1) and the heat radiating frame providing process (step S2) in the process flowchart of FIG. 3 may be reversed. Alternatively, both the processes may be performed at the same time.

Next, as shown in FIGS. 10 to 14, the resin sealing process (step S3) in the process flowchart of FIG. 3 is performed. FIG. 10 is the cross-sectional view (corresponding to line B-B of FIG. 4) during the resin sealing process shown in FIG. 3. FIG. 11 is the cross-sectional view (corresponding to line C-C of FIG. 4) during the resin sealing process shown in FIG. 3.

As shown in FIGS. 10 and 11, with a back surface of the lead frame 10 stacked over a main surface of the heat radiating frame 20, both the frames are arranged in a molding die 30, and the resin sealing process is performed.

The molding die 30 has an upper mold 31 and a lower mold 32. Although FIG. 10 shows an example where the upper mold 31 is arranged above and the lower mold 32 is arranged below, the upper mold 31 may be arranged below and the lower mold 32 may be arranged above. The upper mold 31 has a mating surface 31f, a bottom face 31b, and a sidewall 31s. The lower mold 32 has a mating surface 32f, a bottom surface 32b, and a sidewall 32s. When the upper mold 31 and the lower mold 32 are closed, a space called a cavity 34 is formed in the molding die 30. The cavity 34 is the space surrounded by the bottom surface 31b as well as the sidewall 31s of the upper mold 31 and the bottom face 32b as well as the sidewall 32s of the lower mold 32.

When the upper mold 31 and the lower mold 32 are closed such that the main surface of the lead frame 10 is in contact with the mating surface 31f of the upper mold 31 and the back surface of the heat radiating frame 20 is in contact with the mating surface 32f of the lower model 32, the semiconductor chip 2, part of the lead 12, the wire 4, the chip mounting part 15, and the heat radiating plate 22 are arranged in the cavity 34. As shown in FIG. 10, the back surface of the lead 12 of the lead frame 10 is in contact with the main surface of the frame body 21 of the heat radiating frame 20. Further, the back surface of the chip mounting part 15 is in contact with the main surface of the frame body 21 of the heat radiating plate 22. Accordingly, heat generated in the semiconductor chip 2 can easily be diffused and transmitted to the heat radiating plate 22 via the chip mounting part 15. Moreover, as shown in FIG. 11, the stepped portion 24 provided in the suspending lead 23 of the heat radiating frame 20 is more distantly located from the semiconductor chip 2 or the chip mounting part 15 than the stepped portion 16 provided in the suspending lead 14 of the lead frame 10. The stepped portion 24, however, is located inside the cavity 34.

Next, for example, a resin 35 is injected into the cavity 34 from a gate part 33 provided in the lower mold 32 to form the sealing body 1 described above. The gate part 33 may be provided in the upper mold 31, or may be provided in both the lower mold 32 and the upper mold 31.

FIG. 12 is the plan view during the resin sealing process shown in FIG. 3. Specifically, FIG. 12 is the plan view of the lead frame 10 but does not show the molding die 30 and the heat radiating frame 20. A broken line F in FIG. 12 indicates a region of the cavity 34 of the molding die 30, and an inner area of the broken line F shows the cavity 34. In other words, the broken line F indicates a position where the sidewall $31s$ of the upper model 31 shown in FIG. 10 is in contact with the main surface of the lead frame 10 or a position where the sidewall $32s$ of the lower model 32 is in contact with the back surface of the heat radiating frame 20.

Moreover, in FIG. 12, a broken line G overlaps with the broken line F. The broken line G indicates positions of the sides $21x$ and $21y$ of the heat radiating plate 22 explained in FIG. 7 in the resin sealing process (step S3). The region (region which is given hatching in FIG. 12) outside the broken line G is a region where the lead frame 10 and the frame body 21 of the heat radiating frame 20 overlap with each other. According to the present embodiment, since the broken line G overlaps with the broken line F, as shown in FIG. 10, the end portion (referred to as "side $21y$") on the heat radiating plate 22 side of the frame body 21 of the heat radiating frame 20 is in contact with the cavity 34. That is, when the inside of the cavity 34 is filled with the resin 35 and the sealing body 1 is formed, the end portion (referred to as "side $21y$") on the heat radiating plate 22 side of the frame body 21 comes in contact with the side surface $1c$ of the sealing body 1. In other words, the end portion (side $21y$ or side $21x$) on the heat radiating plate 22 side of the frame body 21 of the heat radiating frame 20 coincides with a position of the sidewall $32s$ of the molding die 30 forming the cavity 34.

In addition, it is important for the broken line G to overlap with the broken line F or to be located between the broken line F and a dam 13. That is, as shown in FIG. 10, it is important for the vertical dam $13b$ (and the horizontal dam $13a$) to overlap with the frame body 21 of the heat radiating frame 20.

Next, FIG. 13 is the plan view after completion of the resin sealing process shown in FIG. 3. FIG. 14 is the cross-sectional view taken along line H-H of FIG. 13. FIGS. 13 and 14 show the state where the sealing body 1 is taken out of the molding die 30. In addition, although FIG. 13 is a drawing where the sealing body 1 and the lead frame 10 are seen from the main surface $1a$ side of the sealing body 1, the heat radiating frame 20 is not shown there. As in FIGS. 13 and 14, a thin-film resin 40 is formed along a circumference of the sealing body 1. As clearly seen in FIGS. 13 and 14, the thin-film resin is formed over the frame body 21 of the heat radiating frame 20 and in a region surrounded by the sealing body 1, the lead 12 adjoining the sealing body 1, and the dam part 13. The film thickness thereof is substantially equal to the film thickness of the lead frame 10. The film thickness of the thin-film resin 40 is smaller than the thickness (distance between the main surface $1a$ and the back surface $1b$) of the sealing body 1.

Next, as shown in FIG. 15, the gate part resin cutting process (step S4) in the process flowchart of FIG. 3 is performed.

FIG. 15 is the cross-sectional view (corresponding to line C-C of FIG. 4) during the gate part resin cutting process shown in FIG. 3. As shown in FIG. 15, the gate part resin $33r$ shown by the broken line is separated from the sealing body 1.

Next, as shown in FIGS. 16 and 17, the heat radiating frame separating process (step S5) in the process flowchart of FIG. 3 is performed. FIG. 16 is the cross-sectional view (corresponding to line C-C of FIG. 4) during the heat radiating frame separating process shown in FIG. 3. FIG. 17 is the cross-sectional view (corresponding to line B-B of FIG. 4) during the heat radiating frame separating process shown in FIG. 3.

As shown in FIG. 16, in a boundary part of the suspending lead 23 and the frame body 21 of the heat radiating frame 20, the frame body 21 is cut off and separated from the suspending lead 23. In this regard, as shown in FIG. 17, the frame body 21 of the heat radiating lead 20 in contact with the back surface of the lead 12 is also separated outside the sealing body 1.

In addition, when the gate part 33 is located on the heat radiating frame 20 side, the gate part resin cutting process (step S4) and the heat radiating frame separating process (step S5) can be performed at the same time.

Next, as shown in FIGS. 18 and 19, the inspecting process (step S6) in the process flowchart of FIG. 3 is performed. FIG. 18 is the cross-sectional view during the inspecting process shown in FIG. 3. FIG. 19 is the fragmentary (region I in FIG. 13) enlarged plan view in the inspecting process shown in FIG. 3.

As shown in FIG. 18, with respect to the lead frame 10 provided with the sealing body 1 being an inspection object, there are arranged a lighting system 41 on the back surface $1b$ side of the sealing body 1 and a camera 42 on the main surface $1a$ side of the sealing body 1. In this state, a resin-unfilled error inspection in the resin sealing process (step S3) is performed. That is, the sealing body 1 is arranged between the lighting system 41 and the camera 42. The lighting system 41 includes, for example, a light source where a plurality of white LEDs are arranged in a matrix pattern and an optical diffuser which covers them. The camera 42 includes, for example, a CCD camera.

As shown in FIG. 19, there is inspected whether or not a region surrounded by the sealing body 1, the dam part $13a$ or $13b$, and the adjoining leads 12 is completely filled with the thin-film resin 40. Similarly, with respect to the corner portion of the sealing body 1, there is inspected whether or not a region surrounded by the sealing body 1, the dam part $13a$ or $13b$, the leads 12, and the suspending lead 14 or the frame body 11 is completely filled with the thin-film resin 40. That is, if a resin-unfilled region ever exists, the resin-unfilled region is found by detecting transmitted light from the lighting system 41 with the camera 42. This inspection is performed all over the circumference of the sealing body 1.

As described above, the thin-film resin 40 has a film thickness of 0.15 mm, which is almost equal to that of the lead frame 10. Because the resin also contains silica etc., the thin-film resin 40 blocks the white light from the lighting system 41 to a considerable degree.

In this regard, since the frame body 21 of the heat radiating frame 20 is separated and removed from the lead frame 10 before the inspecting process (step S6), the white light from the lighting system 41 is not blocked by the frame body 21 of the heat radiating frame 20, enabling the detection of the resin-unfilled region.

Also, as described above, the inspection is performed in a state where there are arranged the lighting system 41 below and the camera 42 above the lead frame 10 provided with the sealing body 1 to be inspected. Therefore, it becomes possible to reduce incorrect recognition of the detected image by the camera 42 which might be caused by foreign matters (for example, resin burrs) falling off from an inspection object and adhering to the camera 42.

Next, as shown in FIG. 20, the dam part cutting process (step S7) in the process flowchart of FIG. 3 is performed. FIG. 20 is the plan view during the dam part cutting process shown in FIG. 3.

As shown in FIG. 20, with use of a cutting jig, such as a punching die, the dam parts 13a and 13b between the adjacent leads 12 are cut and removed, and the adjoining leads 12 are separated. In the dam part cutting process (step S7), together with the dam parts 13a and 13b, the thin-film resin 40 is also removed.

In the resin sealing process (step S3) of the process flowchart in FIG. 3, the frame body 21 of the heat radiating frame 20 is so arranged as to overlap with the dam part 13 of the lead frame 10. Consequently, the film thickness of the thin-film resin 40 can be made thin, and chipping of the side surface 1c of the sealing body 1 can be reduced in the dam part cutting process (step S7).

Suppose that the broken line F shown in FIG. 12 is located outside (opposite side of the semiconductor chip 1 or the chip mounting part 15, i.e., the frame body 13 side) of the dam part 13. Then, as can be assumed from FIG. 14, the film thickness of the thin-film resin 40 becomes more than twice as thick as that of the present embodiment. That is, the film thickness becomes 0.35 mm, which is the sum of 0.15 mm being the film thicknesses of the lead frame 10 and 0.2 mm being the film thicknesses of the heat radiating frame 20. Further, in the dam part cutting process (step S7), together with the dam part 13, a thicker thin-film resin 40 is cut. Therefore, chipping or cracks may occur in the side surface 1c of the sealing body 1, resulting in errors.

Next, a plating process (step S8) in the process flowchart of FIG. 3 is performed. In the plating process (step S8), solder plating is applied to the main surface and the back surface of the outer lead portion OL located outside the sealing body 1.

Next, as shown in FIGS. 21 and 2, the lead forming process (step S9) in the process flowchart of FIG. 3 is performed. FIG. 21 is the plan view during the lead forming process shown in FIG. 3.

First, as shown in FIG. 21, the other end of the lead 12 is cut and separated from the frame body 11 of the lead frame 10. Then, the lead 12 is shaped into a shape shown in FIG. 2.

Next, a turn-into-pieces process (step S10) in the process flowchart of FIG. 3 is performed. By cutting the suspending lead 14 shown in FIG. 21 in a boundary part with the sealing body 1, the semiconductor device SD shown in FIG. 2 is completed.

<Principal Features and Effects of Method for Manufacturing Semiconductor Device of the Present Embodiment>

In a state where the lead frame 10 with the semiconductor chip 2 mounted thereon and the heat radiating frame 20 having the heat radiating plate 22 are stacked, the semiconductor chip 2 is sealed with resin and the sealing body 1 is formed. Then, after separation of the frame body 21 of the heat radiating frame 20 from the lead frame 10 having the sealing body 1, the inspection to detect resin-unfilled regions is applied to the lead frame 10 having the sealing body 1.

Since an inspection region is not shielded by the frame body 21 of the heat radiating frame 20, it becomes possible to detect the resin-unfilled regions using transmitted light.

In the inspection using the transmitted light, it becomes possible to improve detection accuracy of the resin-unfilled regions. For instance, in an inspection method using reflected light, a sufficient contrast cannot be obtained between the lead 12 and the resin, making it difficult to improve the detection accuracy.

According to the present embodiment, however, with the lead frame 10 and the heat radiating frame 20 having the heat radiating plate 22 being stacked, the semiconductor chip 2 is resin sealed to form the sealing body 1. Consequently, as compared to the manufacturing method of coupling the heat radiating plate to the lead frame before the sealing process, it becomes possible to reduce manufacturing cost or to improve production yield of the semiconductor device SD with the built-in heat radiating plate 22.

Further, according to the present embodiment, the inspection to detect the resin-unfilled regions is performed all over the circumference of the sealing body 1. Therefore, even when a halogen-free high-fluidity resin is used, it becomes possible to improve reliability of the semiconductor device SD with the built-in heat radiating plate 22.

Still further, in the inspecting process, the lighting system 41 is arranged below the inspection object and the camera 42 is arranged above the inspection object. In this way, it becomes possible to prevent incorrect recognition by the camera 42 which might be caused by foreign matters falling off from the inspection object and adhering to the camera 42. Thus, the inspection accuracy can be improved.

In the resin sealing process, an end portion (side 21x or 21y) of the frame body 21 of the heat radiating frame 20 is located between the dam part 13 and the heat radiating plate 22 of the lead frame 10. More specifically, the end portion (side 21x or 21y) of the frame body 21 of the heat radiating frame 20 is located between the dam part 13 of the lead frame 10 and the cavity 34 of the molding die 30. Therefore, in the dam part cutting process, the film thickness of the thin-film resin 40 can be made thinner, and chipping at the side surface 1c of the sealing body 1 can be reduced. Further, as shown in FIG. 10, the end portion (side 21x or 21y) of the frame body 21 of the heat radiating frame 20 is preferred to be located at a cross point A of a mating surface 32f and a sidewall 32s. That is, the end portion (side 21x or 21y) of the frame body 21 of the heat radiating frame 20 is in contact with the cross point A. Moreover, the end portion (side 21x or 21y) of the frame body 21 of the heat radiating frame 20 is preferred to be located closer to the cavity 34 side of the molding die 30 than the end portion of the chip mounting part 15 side, of the dam part.

Although the invention made by the present inventors has been described specifically based on the embodiment, it is needless to say that the present invention is not limited to or by it but can be changed variously without departing from the gist of the invention.

In the embodiment described above, the example of the QFP type semiconductor device was specifically explained. However, the present invention can also be applied to an SOP (Small Outline Package) type semiconductor device.

In the QFP type semiconductor device, as shown in FIG. 1, the leads 12 protrude from four sides of the sealing body 1. On the other hand, in a case of the SOP type semiconductor device, in a plan view, leads are exposed from two opposed sides of a rectangular sealing body. Other than that, however, a configuration of the SOP is similar to that of the embodiment described herein.

What is claimed is:

1. A method for manufacturing a semiconductor device, comprising the steps of:
    (a) providing a first lead frame having a first main surface and a first back surface opposite to the first main surface,
    wherein the first lead frame includes:
    a chip mounting part with a semiconductor chip mounted over the first main surface;
    a plurality of leads arranged around the chip mounting part, each of which having one end and the other end;
    a first frame body to which the other ends of the leads are joined;
    a dam part located between the one ends of the leads and the first frame body, joining the leads with each other; and
    a first suspending lead joining the chip mounting part with the first frame body;
    (b) providing a second lead frame having a second main surface and a second back surface opposite to the second main surface,
    wherein the second lead frame includes:
    a heat radiating plate having the second main surface over which the chip mounting part is mounted;
    a second frame body surrounding a circumference of the heat radiating plate; and
    a second suspending lead joining the heat radiating plate with the second frame body;
    (c) arranging the first lead frame and the second lead frame in a molding die having a cavity part in a state where the first lead frame and the second lead frame are stacked such that the second main surface and the first back surface face with each other and, further, sealing the semiconductor chip, the chip mounting part, and the heat radiating plate with a resin to form a sealing body,
    wherein a sidewall of the molding die forming the cavity part is located closer to the chip mounting part side than the dam part;
    (d) removing the sealing body from the molding die and cutting the second frame body off the sealing body; and
    (e) after the step (d), inspecting whether or not a region surrounded by the sealing body, the dam part, and the leads is filled with the resin.

2. The method for manufacturing a semiconductor device according to claim 1, wherein the step (e) is performed all over a circumference of the sealing body.

3. The method for manufacturing a semiconductor device according to claim 1,
    wherein the sealing body has an upper surface located over the first main surface side and a lower surface located opposite to the upper surface and, at the same time, over the second back surface side, and
    wherein, in the step (e), a lighting system is so arranged as to face the lower surface of the sealing body, and a camera is so arranged as to face the upper surface of the sealing body.

4. The method for manufacturing a semiconductor device according to claim 1, wherein the sealing body is arranged between the lighting system and the camera.

5. The method for manufacturing a semiconductor device according to claim 1,
    wherein, in the step (c), a first side of the second frame body on the heat radiating plate side is located between the dam part and the sidewall of the molding die, and
    wherein, in the step (e), the sealing body is arranged between the lighting system and the camera.

6. The method for manufacturing a semiconductor device according to claim 5, wherein, in the step (c), the dam part overlaps with the second frame body.

7. The method for manufacturing a semiconductor device according to claim 6,
    wherein the dam part has, in a first direction in a plan view, a first dam part and a second dam part opposed to each other, and
    wherein the second frame body has, in the first direction, the first side and the second side opposed to each other, and
    wherein, in the first direction, a first spacing between the first side and the second side is smaller than a second spacing between the first dam part and the second dam part.

8. The method for manufacturing a semiconductor device according to claim 5, wherein the first side of the second frame body on the heat radiating plate side coincides with a position where a sidewall of the molding die comes in contact with the first main surface of the lead.

9. The method for manufacturing a semiconductor device according to claim 1,
    wherein, in the step (c), the molding die has a gate part from which the resin is injected into the cavity part, and
    wherein, in the step (d), after removal of the sealing body from the molding die, the resin of the gate part is separated from the sealing body and, then, the second frame body is cut off from the sealing body.

10. The method for manufacturing a semiconductor device according to claim 1, further comprising, after the step (e), a step of:
    (f) cutting off the dam part and separating the leads from each other.

11. The method for manufacturing a semiconductor device according to claim 10, further comprising, after the step (f), a step of:
    (g) shaping the leads after cutting off the other ends of the leads from the first frame body.

12. The method for manufacturing a semiconductor device according to claim 1, wherein, in a plan view, an area of the heat radiating plate is larger than an area of the chip mounting part.

13. The method for manufacturing a semiconductor device according to claim 1, wherein, in the step (d), by cutting the second suspending lead outside the sealing body, the second frame body is cut off from the sealing body.

* * * * *